United States Patent [19]

Moy et al.

[11] Patent Number: 5,252,255
[45] Date of Patent: Oct. 12, 1993

[54] CONDUCTIVE METAL-FILLED SUBSTRATES VIA DEVELOPING AGENTS

[75] Inventors: Paul Y. Y. Moy, Des Plaines; William J. E. Parr; Dieter Frank, both of Naperville, all of Ill.; Ronald E. Hutton, Faversham, England

[73] Assignee: Akzo America Inc., Dobbs Ferry, N.Y.

[21] Appl. No.: 521,772

[22] Filed: Jun. 11, 1990

Related U.S. Application Data

[62] Division of Ser. No. 204,137, Jun. 8, 1988, Pat. No. 4,961,879.

[51] Int. Cl.$^5$ .............. H01B 1/00; H01B 1/02; H01B 1/20; H01B 1/22
[52] U.S. Cl. .................... 252/512; 252/513; 419/10; 419/31; 419/34; 419/57; 427/337
[58] Field of Search ............ 252/512, 513, 518; 419/10, 31, 34, 57; 427/337

[56] References Cited

U.S. PATENT DOCUMENTS

| | | | |
|---|---|---|---|
| 4,705,647 | 11/1987 | Yamaguchi et al. | 252/512 |
| 4,830,779 | 5/1989 | Maeno et al. | 252/513 |
| 4,997,674 | 3/1991 | Parr et al. | 427/367 |

FOREIGN PATENT DOCUMENTS 0170063 6/1985 European Pat. Off.
0221434 10/1986 European Pat. Off.

*Primary Examiner*—Paul Lieberman
*Assistant Examiner*—M. Kopec
*Attorney, Agent, or Firm*—Louis A. Morris

[57] ABSTRACT

A conductive metal-filled substrate is formed by intermingling copper or nickel particles into the substrate, contacting the metal particles with a specified developing agent, and heating the metal particles and the developing agent. The filled substrates are electrically conductive and are useful for a variety of uses such as EMI shielding.

20 Claims, No Drawings

CONDUCTIVE METAL-FILLED SUBSTRATES VIA DEVELOPING AGENTS

This is a division of application Ser. No. 204,137 filed Jun. 8, 1988, now U.S. Pat. No. 4,961,879.

BACKGROUND OF THE INVENTION

This invention relates to the formation of substrates which contain a filler such that the filled substrate is rendered electrically conductive. In particular, this invention relates to such a process wherein the conductive filler is formed from discrete metal particles of copper or nickel.

It is frequently desired to incorporate a conductive metal filler in a (generally) non-conductive substrate. Such composites are useful for electromagnetic interference (EMI) shielding and so forth.

Applicants' co-pending application titled Conductive Metallization of Substrates Ser. No. 068,593, ABN and the art cited therein, deals with the problem of forming a layer of conductive metal on the surface of a substrate. In contrast, the instant invention deals with the problem of rendering an entire three-dimensional substrate conductive.

SUMMARY OF THE INVENTION

In one aspect the invention is a method of forming a metal-filled conductive substrate in which the metal particles are incorporated into the substrate, contacted with a developer, and heated.

In another aspect the invention is a filled substrate made by the above method.

The method of the invention is convenient to carry out, involves relatively non-corrosive materials, and produces coherent, very conductive metal-filled substrates.

DETAILED DESCRIPTION OF THE INVENTION

One element of the invention is the use of nickel or copper particles. In general, any nickel or copper which is in the form of a powder is suitable for use in the invention. Of some importance is the particle size of the nickel or copper. The principal difficulty with large particle sizes is that of obtaining a uniform distribution of particles in the substrate and ensuring adequate particle-to-particle contact in the three dimensions of the substrate. Generally, the particle size will be below 30, preferably below 20, and more preferably below 10 um.

The copper or nickel need not be particularly pure and in fact significant amounts (e.g. up to 70%) of oxides may be present. Further, mixtures of copper or nickel with other metals may be used. When mixtures are used, the mixture is desirably at least 40, more desirably at least 50, preferably at least 60, and most preferably at least 70 weight % copper and/or nickel.

The metal particles are distributed in a substrate. Suitable substrates include virtually any material which is capable of temporarily being in a relatively soft, deformable state so as to be able to intermingle the metal powder into its volume and is capable of being in a relatively hard, non-deformable state so as to be able to provide a relatively undisturbed distribution of the metal after the metal has become intermingled. Thus, materials such as glass, natural resins (e.g.: unvulcanized natural rubber), and synthetic resins are suitable, with synthetic resins being preferred.

For purposes of the invention, suitable synthetic resins may be divided into two categories; thermoplastic resins and uncured resins. Thermoplastic resins are typically employed by powder blending or melt blending the metal powder into the resin. "Uncured" resins are typically employed by providing them in a completely uncured or semi-cured state (sufficiently uncured that the metal particles can intermingle with the resin), mixing the metal particles with the resin, and curing the resin to cause it to harden.

Suitable thermoplastic resins include polyolefins such as polyethylene, polypropylene and polybutadiene; halogenated polyolefins such as polyvinlidenedifluoride (PVDF); styrenics such as polystyrene, high impact polystyrene (HIPS), acrylonitrile butadiene-styrene (ABS), and stryrene-acrylonitrile (SAN); acrylics such as polymethylmethacrylate (Plexiglass); polyaryl ethers such as polyphenylene oxide (Noryl); polyamides such as nylon 6; and polyesters such as polybutyleneterephtholate (PBT). The resins may optionally contain fillers such as glass fibers.

Exemplary "uncured" resins include thermoset resins such as epoxy, unsaturated polyester, and silicone rubber. Other uncured (or semi-cured) resins such as UV cure, electron beam cure, and ionizing radiation cure resins may also be employed. The presence of the metal, however, means that complete curing by these means can only take place in relatively thin layers.

The substrates are illustratively formed into thin (e.g.: 0.5 to 1 mm) sheets but other forms (e.g.: cubes, shperes, etc.) would be suitable. The substrates may be selected from the usual commercial grades of available materials, and no special handling or treatment is required.

In is a requirement of the invention that the metal particles are contacted with a developing agent. Suitable developing agents include tertiary amines, tertiary phosphorus compounds, and bifunctional compounds having both (a) a first atom which is a trivalent nitrogen or a bivalent sulfur and (b) at least one second atom which is nitrogen or oxygen, the first and second atoms being separated by at least two other atoms (preferably carbon); the bifunctional compound (1) being capable of forming a coordination complex (preferably a chelator complex) with copper or nickel. It is preferred that the developing agents be of sufficiently high molecular weight that evaporation of the developing agent at the developing temperature does not interfere with the process of the invention. Generally, a molecular weight of at least 150 is preferred and a molecular weight of at least 250 is more preferred. Very low molecular weight compounds may also have a tendency to pit the substrate.

Exemplary tertiary amines include long-chain aliphatic tertiary amines such as methyldicocoamine and dimethylcocoamine, and tertiary amines which may contain a degree of unsaturation such as dimethyltallowamine.

Tertiary amines can be generated in situ by the use of a quaternary ammonium salt, provided that the developing temperature is sufficiently high that the salt thermally degrades to a tertiary amine. Thus, compounds such as dicocodimethylammonium chloride and N,N,N',N',N'-pentamethyl-N-tallow-1,3-propanediammonium dichloride may be used for in situ generation of tertiary amines. This approach has the drawback, however, that the counter ions (e.g.: chloride ions) can cause corrosion.

Suitable tertiary phosphorous compounds (P (III) compounds) include tertiary phosphines such as triphenylphosphine (triphenylphosphorous, $(C_6H_5)_3P$) and tertiary phosphites such as tributyl phosphite $(CH_3(CH_2)_3P)$.

Suitable bi-functional compounds include alkanolamines such as 2-hydroxyethylamine, 3-hydroxypropylamine, 4-hydroxybutylamine, 6-hydroxyhexylamine, and 2-hydroxy-1-ethylethylamine; aromatic hydroxy amines such as ortho-aminophenol; diamines such as N-methyl-1,2-diaminoethane; secondary amino alcohols such as diethanolamine, N-methylethanolamine, N-tert butyl ethanolamine, and N,N'-diethanolethylenediamine; tertiary amino alcohols such as triethanolamine, N,N-bis (2-hydroxyethyl)cocoamine, and N,N-bis(2-hydroxyethyl) tallowamine; primary amines such as N-acetyl ethylene diamine; tertiary amines such as bis-[N,N-2-hydroxyethyl]dodecanamide and bis-[N,N-2-hydroxyethyl]formamide; secondary sulfides such as bis-[2-hydroxyethyl]sulfide and dilaurylthiodipropionate; hydrazides such as oxalic acid bis [cyclohexylidene hydrazide] (also known as Cuprizon 1) and salicyl hydrazide; hydrazones such as salicyl hydrazone; and oximes such as salicylaldoxime.

In selecting a suitable bifunctional compound it is important to realize that the minimum 2 atoms which must separate the two functional atoms also represents the preferred maximum number of interposed atoms. Thus, it is desirable that no more than 6, more desirable that no more than 5, preferred that no more than 4, more preferred that no more than 3, and most preferred that 2 atoms separate the two functional atoms. In molecules with limited flexibility about the bonds (e.g.: in aromatic structures) even three intervening atoms will cause the molecule to have little activity or none at all. In determining whether or not a compound is a bifunctional compound according to the invention (i.e.: meets the requirement of being able to form a coordination complex), a useful guide is the theoretical minimum intramolecular distance between said first and second atoms. This distance is generally less than 0.48 nm, desirably less than 0.40 nm, more desirably less than 0.35 nm, preferably less than 0.30 nm, and most preferably less than 0.29 nm. Further details concerning the selection of suitable developing agents may be found in the aforementioned Ser. No. 068,593, which is incorporated herein by reference.

The metal particles are intermingled with the substrate by any means which will achieve a distribution of particles sufficiently uniform that a conductive three-dimensional substrate can be achieved.

In the case of thermoplastic resins, the metal particles can be incorporated into the resin by melt blending or by powder blending. In the case of uncured resins, room-temperature blending is suitable. Any conventional mixing apparatus is suitable.

The metal particles are contacted with the developer by any convenient means. One simple means is to spray a liquid developer or a solution of a solid developer onto the metal particles before they are incorporated into the substrate. Another method is to blend the developing agent into the substrate either before or after the metal particles are added. A further method is to add the metal to a homogeneous melt phase of the substrate in the developer at elevated temperature (such phases are described more extensively in U.S. Pat. No. 4,519,909). In the latter case excess developer is extracted from the polymer mixture, after cooling, to leave a microporous, metal loaded, polymer powder which is then suitable for typical forming operations (e.g. compression molding). A further method is to contact the metal with developer at elevated temperature prior to incorporation of the metal into the substrate, in addition to or instead of adding developer to the resin. In the case of thermosetting resins the substrate may be contacted with the metal and developer by normal compounding means (e.g. 3-roll mill) either before or after addition of the developing agent and then subjected to a heating step in which the temperature is sufficient to render the developer of the invention active, as well as a temperature sufficient to effect complete curing of the substrate.

The developer should be present in an effective amount. That is, an amount sufficient to render the metal particles conductive. Typically, the developer will be present at 1 to 200, desirably, 2 to 100, preferably 4 to 20, and more preferably 5 to 10 weight percent, based on the weight of the metal. If the metal is pretreated with developer as described above, the amount of developer in the resin can be substantially reduced or eliminated.

Whether or not heat is used to aid the intermingling of the metal into the substrate (as with thermoplastics), heat is necessary to activate the developing agent. The temperature needed for activation can vary with the particular developer chosen. Generally, a temperature of 150° to 300° C., preferably 180° to 250° C., and more preferably 200° to 220° C. is required for activation.

If the developing agent is heated as part of the mixing process, then the heating for mixing and the heating for developing can be a single heating step, provided that the temperature is sufficiently high for each process.

Similarly, the heat used to cure a thermoset resin can be the heat used to activate the developer, or the two heating steps can be distinct if the requisite temperatures are distinct.

The conductive substrates of the invention are useful in a wide variety of applications including EMI shielding, battery plates, electrical switches, and decorative panels.

The following examples are set forth to further explain the invention.

EXAMPLE 1 (COMPARATIVE)

To a 2-roll mill operating at 200° C. was added 90 g of polypropylene (Himont PD195). After "banding" (i.e.: the formation of a continuous ribbon of polymer) had occurred, 60 g of copper powder (Poudmet 22BB400) was added to the polymer (to afford a formulation containing 40% of copper by weight), and mixing continued for 15 minutes at 200° C. The polymer mix was removed from the mill and subjected to compression molding at 215° C. under 5 tpsi (69 MPa) pressure, in a closed steel mold, for 15 minutes. After cooling a 6"×3"×0.125" (152×76.2×3.17 mm) sample was obtained with an orange appearance. The volume resistivity of this was measured according to DIN 53596 and found to $6 \times 10^{15}$ ohm cm; i.e., highly non-conductive.

EXAMPLE 2

82.5 g of polypropylene, and 60 g of copper powder were mixed on a two-roll mill as described in Example 1, but with the addition of 7.5 g of N,N-bis(2-hydroxyethyl) tallowamine (to give a formulation containing 40% copper and 5% amine by weight). After mixing and molding cycles identical to those in Example 1, the polymer sample obtained was pink in color and possessed a volume resistivity of 15.9 ohm cm. The presence of an amine of the present invention had thus caused an improvement in the conductivity of copper filled polypropylene of $10^{14}$ ohm cm. In a similar manner 30% copper and 5% of the amine by weight were incorporated; a mold cycle of 30 minute at 215° C. was used. The sample possessed a volume resistivity of 0.24 ohm cm. A further reduction of the copper level to 25% by weight resulted in a sample with a volume resistivity of $10^{15}$ ohm cm.

EXAMPLE 3

90 g of polypropylene (Himont PP 6523) and 60 g of nickel powder (Alcan 756) were compounded on a two-roll mill in a manner similar to Example 1 for 10 minutes at 185° C. (to give a formulation containing 40% of nickel by weight). The polymer mix was then removed from the mill and molded as in Example 1 for 30 minutes at 215° C. The sample obtained possessed a volume resistivity of $10^{15}$ ohm cm.

EXAMPLE 4

82.5 of polypropylene and 60 g of nickel powder were mixed on a two-roll mill as in Example 3, but with the addition of 7.5 g of N,N-bis(2-hydroxyethyl) tallowamine (to give a formulation containing 40% nickel and 5% amine by weight). After mixing a molding cycles identical to that in Example 3, the polymer sample obtained possessed a volume resistivity of 1.03 ohm cm. Thus the incorporation of a developer of the present invention results in an improvement in volume resistivity of $10^{15}$ ohm cm.

EXAMPLE 5

82.5 g of polypropylene and 60 g of copper powder were compounded on a two-roll mill at 185° C., and 7.5 g of N,N-bis(2-hydroxyethyl) dodecanamide added. After mixing for 10 minutes the formulation (containing 40% copper and 5% amide by weight) was removed from the mill and compression molded as in Example 1 but for 30 minutes at 215° C. The specimen obtained possessed a volume resistivity of 8.5 ohm cm. Thus amide developers of the present invention significantly improve the conductivity of copper filled polypropylene.

EXAMPLE 6 (COMPARATIVE)

Polypropylene powder (Himont PP6501) was hand blended with copper powder (Poudmet 22BB400) to afford a blend containing 40% by weight of copper. This mixture was subjected to compression molding, at 265° C. for 60 minutes, in a closed cavity mold to afford a 0.125 thick plaque. Upon removal from the mold the sample exhibited a volume resistivity in excess of $10^{13}$ ohm cm.

EXAMPLE 7

The same polypropylene powder used in Example 6 was mixed in a Waring blender with 2% by weight of tributyl phosphite. The treated polymer was then hand mixed with copper powder to afford a blend containing 40% of copper by weight. The mixture was then molded as described in Example 6. The sample obtained exhibited a volume resistivity of 0.1 ohm cm and a surface resistivity of 0.1 ohm/square. The use of a phosphorus (III) compound of the present invention has thus greatly improved the volume resistivity of the copper filled polymer.

EXAMPLE 8 (COMPARATIVE)

A. Polypropylene containing 40% by weight of copper was prepared as in Example 2, except that 5% by weight of N,N-dimethyllauramide was used in place of N/N-bis(2-hydroxyethyl) tallowamine. After molding for 30 minutes at 215° C., the sample obtained was orange in color and possessed a volume resistivity of greater than $10^{13}$ ohm cm.

B. A similar polypropylene sample was prepared using 5% by weight of cocoamine in place of the N,N-dimethyl lauramide. The volume resistivity of samples molded from this formulation were greater than $10^{13}$ ohm cm.

These two examples show that nitrogen containing compounds which are outside the scope of the present invention are not effective agents for enhancing the conductivity of copper (or nickel) filled polymers.

EXAMPLE 9 (COMPARATIVE)

Polypropylene was compounded on a two roll mill at 185° C. with aluminum powder (Alcan 2100) so as to give a mixture containing 35% aluminum by weight. After mixing for 10 minutes the polymer was removed from the mill and subjected to compression molding at 230° C. for 15 minutes, and a ⅛" thick sample obtained; the sample exhibited a volume resistivity of $10^7$ ohm cm. A similar procedure was then performed to produce a sample containing 35% aluminum and 5% N,N-bis(2-hydroxyethyl) tallowamine by weight. This sample possessed a volume resistivity of $10_5$ ohm cm. These results indicate that developers of the present invention cannot be used to markedly enhance the conductivity of metal-filled polymer substrates when the metal used is neither copper nor nickel.

EXAMPLE 10

High-impact polystyrene (Dow 492U) was compounded on a two-roll mill with copper powder, or with nickel powder, and with N,N-bis(2-hydroxyethyl) tallowamine using a mixing cycle of 10 minutes at 185° C. Formulations were prepared to contain 5% of amine and 40% of either copper or nickel by weight. After removal from the mill the formulations were subjected to compression molding for 30 minutes at 215° C. in a 6"×6"×0.125" closed cavity mold. After the cooling samples were cut and assessed for conductivity and EMI shielding effectiveness. The copper filled sample possessed a volume resistivity of 7.5 ohm cm and shielding values of 33, 26, 27, 12 dB (at 30, 100, 300, 1000 MHz), while the values for the nickel filled polymer were 3.7 ohm cm and 39, 20, 38, 33 dB. For corresponding formulations containing no amine but only 40% by weight of either metal almost zero EMI shielding was observed, together with volume resistivities in excess of $10^{16}$ ohm cm. As in polypropylene the presence of developers of the present invention in copper or nickel filled HIPS causes a dramatic improvement in both conductivity and EMI shielding effectiveness. The conditions used above were not optimized.

EXAMPLE 11

Polypropylene (Himont-PP6523) was mixed with varying levels of copper or nickel and varying amounts of N,N-bis(2-hydroxyethyl) tallowamine. The mixtures were fed to a Haake twin screw extruder operating with barrel temperatures of 165/185/205/205° C. Residence time of the polymer in the barrel was less than one minute. The extrudate in each case was pelletized and dried at 80° C. The extrudates were subjected to compression molding in a closed mold at 215° C. to afford samples which were assessed for volume resistivity.

TABLE I

| Metal | Wt % Metal | Wt % Amine | Mold Time (m) | Volume Resistivity (ohm cm) |
|---|---|---|---|---|
| Cu | 30 | 6 | 60 | 86.6 |
| Cu | 40 | 3 | 60 | Greater than $10^{13}$ |
| Cu | 40 | 6 | 45 | 0.216 |
| Ni | 40 | 3 | 45 | Greater than $10^{13}$ |
| Ni | 40 | 6 | 45 | 4.05 |

These results indicate that copper or nickel filled plastics containing developers of the present invention can be compounded by extrusion and exhibit enhanced conductivity when compression molded.

The formulations listed above were fed to a 50 ton Newbury injection molding machine operating with barrel temperatures of 230°-255° C. and injection molded at a mold temperature of 60°-65° C. and a cycle time of 60 seconds to afford dogbone specimens. These specimens were non-conductive in all cases. This may be attributed to insufficient time at 230° C. being available for the developer to function effectively; thus when the dogbone samples were remolded in a closed cavity mold for 45-60 minutes at 215° C. the nickel filled samples were converted to high conductivity (below 1 ohm cm).

EXAMPLE 12

The following data illustrates the effect of milling time and temperature upon the volume resistivity, and the EMI shielding effectiveness of polypropylene compounded to contain 40% copper and 5% N,N-bis(2-hydroxyethyl) tallowamine. The copper and amine were compounded into the polymer on a two-roll mill at the temperature, and for the time, shown in the Table. The formulations were then compression molded in closed steel cavity molds at the temperature, and for the time, shown in the Table. From the sample obtained a 6"×3"×01.125" thick sample was cut and used to assess volume resistivity and also EMI attenuation by the near-field method (ASTM ES7-85) at four discrete frequencies.

TABLE II

| Roll Mill Temp °C. | Roll Mill Time (m) | Molding Temp (°C.) | Molding Time (m) | Volume Resistivity (ohm cm) | EMI Attenuation (dB) at 30 | 100 | 300 | 1000 MHz |
|---|---|---|---|---|---|---|---|---|
| 183 | 10 | 200 | 30 | 38 | 10 | 5 | 19 | 5 |
|  |  | 215 | 30 | 0.5 | 56 | 44 | 68 | 74 |
| 193 | 10 | 200 | 30 | 6.9 | 10 | 5 | 19 | 3 |
|  |  | 215 | 30 | 0.4 | 62 | 46 | 64 | 79 |
| 206 | 10 | 200 | 30 | 3.9 | 22 | 20 | 26 | 10 |
|  |  | 215 | 30 | 0.4 | 62 | 50 | 65 | 91 |
|  |  | 215 | 10 | 0.7 | 62 | 46 | 61 | 84 |
| 206 | 20 | 200 | 20 | 3800 | 19 | 8 | 20 | 7 |
|  |  | 215 | 30 | 19 | 32 | 31 | 28 | 9 |

The results illustrate that the molding cycle temperature and time are of greater importance than the milling temperature in obtaining a polymer which possess high conductivity and good EMI shielding characteristics. Furthermore the data shows that too long a milling time results in a increase in volume resistivity and a decrease in EMI shielding effectiveness; this can be attributed to decrease in effective surface area of the metal filler under the influence of high shear mixing.

EXAMPLE 13

This example indicates how the molding conditions influence the EMI shielding effectiveness of a polypropylene (Himont PD195) containing 40% nickel and 5% N,N-bis(2-hydroxyethyl) tallowamine. All samples were compounded on a two-roll mill for 10 minutes at 183° C. and then compression molded in a closed mold under the conditions depicted in the Table.

TABLE III

| Molding Temp (°C.) | Time (m) | Volume Resistivity (ohm cm) | EMI Shielding (dB) at 30 | 100 | 300 | 1000 MHz |
|---|---|---|---|---|---|---|
| 180 | 60 | $10^{14}$ | 0 | 0 | 6 | 1 |
| 200 | 60 | 0.4 | 51 | 40 | 56 | 55 |
| 200 | 30 | 26.0 | 41 | 29 | 40 | 24 |
| 200 | 15 | $10^{14}$ | 1 | 0 | 6 | 0 |
| 215 | 60 | 0.2 | 61 | 57 | 67 | 80 |
| 215 | 30 | 0.3 | 59 | 52 | 64 | 65 |
| 215 | 15 | 1.1 | 42 | 31 | 45 | 32 |
| 230 | 15 | 0.2 | 61 | 60 | 72 | 82 |
| 230 | 10 | 0.2 | 62 | 57 | 67 | 78 |
| 230 | 5 | 0.3 | 60 | 53 | 65 | 74 |
| 230* | 15 | $10^{13}$ | 0 | 0 | 6 | 1 |

*Sample did not contain N,N,bis (2-hydroxyethyl) tallowamine

The data clearly illustrates that good conductivity and high EMI shielding for nickel filled formulation are only achieved in the presence of a developer of the present invention, and that there is an optimum molding (temperature and time) cycle. As the molding temperature increases the time required to obtain food EMI shielding becomes reduced. Obviously the amine developer becomes more effective at higher molding temperatures. Optimum conditions may be expected to vary somewhat with the polymer used.

EXAMPLE 14

Samples of polypropylene containing 40% nickel and 5% N,N-bis(2-hydroxyethyl) tallowamine by weight obtained under the various molding conditions described in Example 13 were placed in an air over at 90° C. and reassessed for EMI shielding at intervals. The results are shown in Table IV.

TABLE IV

| Molding Temp (°C.) | Time (m) | Final Volume Resistivity (ohm cm) | EMI Shielding (dB) at 30/100/300/1000 MHz | | | |
|---|---|---|---|---|---|---|
| | | | Original | After 7 Days | 14 Days | 21 Days |
| 200 | 60 | 150 | 51/40/56/55 | 35/21/27/15 | 17/11/24/10 | Not measured |
| 200 | 30 | $1.9 \times 10^6$ | 41/29/40/24 | 8/3/17/6 | 1/0/9/3 | Not measured |
| 215 | 60 | 4.5 | 61/57/67/80 | 51/42/58/55 | 46/35/50/36 | 43/30/44/26 |
| 215 | 30 | 68 | 59/52/64/65 | 38/27/36/18 | 20/10/22/9 | Not measured |
| 215 | 15 | 4300 | 42/31/45/32 | 28/19/27/14 | 1/0/13/4 | Not measured |
| 230 | 15 | 3.7 | 61/60/72/82 | 51/42/60/61 | 47/36/50/43 | 44/31/43/32 |
| 230 | 10 | 4.3 | 62/57/67/78 | 52/44/57/38 | 43/36/45/24 | Not measured |
| 230 | 5 | 8.9 | 60/53/65/74 | 43/32/45/26 | 35/28/36/17 | Not measured |

The results reveal that the original molding conditions chosen affect not only the initial EMI shielding effectiveness but also the rate of loss of EMI shielding. Higher molding temperature/times decrease the rate of loss of EMI shielding when the formulation is aged at temperatures above ambient.

EXAMPLE 15

Polypropylene was mixed with varying amounts of nickel powder and also with varying amounts of N,N-bis-(2-hydroxyethyl)tallowamine on a two-roll mill. After mixing for 10 minutes at 185° C. the formulations were compression molded in a closed mold for 15 minutes at 230° C. to afford ⅛" thick samples which were assessed for volume resistivity and EMI shielding. The results are shown in Table V.

TABLE V

| Wt % | | Volume Resistivity | EMI Shielding (dB) at | | | |
|---|---|---|---|---|---|---|
| Nickel | Amine | (ohm cm) | 30 | 100 | 300 | 1000 MHz |
| 40 | 5 | 0.22 | 61 | 60 | 72 | 82 |
| 35 | 5 | 0.33 | 58 | 52 | 64 | 77 |
| 30 | 5 | 0.28 | 57 | 51 | 63 | 77 |
| 25 | 5 | $10^{13}$ | 0 | 0 | 0 | 0 |
| 40 | 3 | 0.42 | 54 | 47 | 64 | 62 |
| 40 | 2 | 1.6 | 49 | 40 | 55 | 51 |
| 40 | 1 | 1.3 | 50 | 39 | 52 | 65 |

The data demonstrates that good conductivity and high EMI shielding can be obtained from nickel filled polypropylene with 30% or more by weight of nickel. Furthermore at the 40% by weight of nickel level, 1% by weight of the amine developer is sufficient to promote conductivity; higher levels of amine effect somewhat better nickel conductivity and higher EMI shielding values, and may be preferred.

EXAMPLE 16

To polypropylene (Himont PP 6523) were added the levels of metallic powder and N,N-bis(2-hydroxyethyl)-tallowamine detailed below. The mixtures were passed through a Haake twin-screw extruder operating with zone temperatures of 165/185/205/200° C. (barrel temperature) to afford ⅛" thick tensile (dogbone) specimens. For each formulation the tensile strength was measured on an Instron machine before aging, and on samples withdrawn after 1, 2, 3 and 4 weeks of aging in an oven held at 90° C. The results of the tensil strength measurements are shown in the Table.

From the results it can be seen that whereas the presence of copper in the formulation results in a dramatic loss of tensile strength upon oven aging, the presence of nickel does not cause any significant loss of tensile strength. Note also that the presence of the particular developer used has a retarding effect upon the rate of loss of tensile strength for formulations which contain copper; this may be because of the ability of the developer to coordinate to copper atoms and thus reduce the number of such species available for catalysis of the autoxidation process. The decrease in the unaged tensile strength for formulations containing the developer can be attributed to the developer acting as a plasticizer.

From these results it can be seen that nickel-filled thermoplastics processed according to the present invention will probably be preferred over copper-filled thermoplastics if the end-formulation is likely to be subjected to extended use at higher temperatures.

TABLE VI

| | Wt % | | Original Tensile Strength | % Original Tensile Strength Retained After Oven Aging At 90° C. for | | | | |
|---|---|---|---|---|---|---|---|---|
| Metal | Metal | Developer | (PSI) | 1 | 2 | 3 | 4 | Weeks |
| Cu | 30 | — | 4151 | 95 | 57.8 | 25.6 | 2.6 | |
| Cu | 30 | 3 | 3119 | 104.5 | 71.4 | 40.2 | 7.5 | |
| Cu | 30 | 6 | 2810 | 103.1 | 80.4 | 56.5 | 40.6 | |
| Cu | 40 | — | 3230 | 102.2 | 54.2 | 16.1 | 2.6 | |
| Cu | 40 | 3 | 2700 | 105.0 | 67.1 | 30.4 | 5.6 | |
| Cu | 40 | 6 | 2172 | 115.0 | 110.8 | 61.8 | 15.0 | |
| Ni | 30 | — | 4010 | 105.8 | 108.3 | 102.8 | 107.7 | |
| Ni | 30 | 3 | 3019 | 106.4 | 110.5 | 107.2 | 110.7 | |
| Ni | 30 | 6 | 2639 | 109.7 | 116.2 | 115.4 | 119.3 | |
| Ni | 40 | — | 3774 | 106.1 | 105.7 | 107.9 | 106.1 | |
| Ni | 40 | 3 | 2822 | 106.1 | 111.1 | 112.6 | 111.3 | |
| Ni | 40 | 6 | 2714 | 102.2 | 109.3 | 106.5 | 108.6 | |

EXAMPLE 17

Nylon 6 (Zytel 211, DuPont) formulations containing various levels of nickel powder (Alcan 756), and of N,N-bis (2-hydroxyethyl) tallowamine, were prepared by supplying a dry blend of the mixtures to the throat of a Haake twin-screw extruder operating with barrel/die temperatures of 195/215/230/220° C. The extrudate was pelletized and dried. The pellets were compression molded in a 6"×6"×⅛" (152×152×3.2 mm) closed steel cavity mold for the times, and at the temperatures shown in the Table. After removal from the mold, 3"×6"×⅛" (76×152×3.2 mm) samples were cut and assessed for volume resistivity and for EMI attenuation (near-field); the results obtained are shown in Table VII.

TABLE VII

| Wt % Nickel | Wt % Amine | Molding Temp (°C.) | Molding Time (m) | Volume Resistivity ohm cm | EMI Attenuation (dB) at | | | |
|---|---|---|---|---|---|---|---|---|
| | | | | | 30 | 100 | 300 | 1000 Mhz |
| 30 | 0 | 240 | 27 | $2.5 \times 10^5$ | 01 | 04 | 06 | 00 |
| 30 | 0 | 240 | 45 | $10^{13}$ | 10 | 03 | 15 | 04 |
| 35 | 0 | 240 | 27 | $10^{13}$ | 00 | 00 | 06 | 00 |
| 35 | 0 | 240 | 40 | $10^{13}$ | 00 | 00 | 06 | 01 |
| 30 | 2.5 | 240 | 27 | 2.4 | 42 | 28 | 39 | 20 |
| 30 | 2.5 | 240 | 45 | 0.24 | 64 | 56 | 72 | 74 |
| 35 | 2.5 | 240 | 17 | 0.24 | 62 | 54 | 65 | 82 |
| 35 | 2.5 | 230 | 15 | 0.22 | 64 | 56 | 70 | 75 |
| 30 | 5.0 | 240 | 27 | 0.23 | 62 | 55 | 67 | 78 |
| 30 | 5.0 | 225 | 15 | 1.6 | 43 | 30 | 44 | 19 |
| 35 | 5.0 | 240 | 20 | 0.21 | 63 | 73 | 77 | 88 |
| 35 | 5.0 | 240 | 15 | 0.18 | 64 | 63 | 77 | 90 |

It can be seen that in the absence of the amine developer of the present invention formulations containing 30 or 35% of nickel powder exhibit high volume resistivity and very low EMI attenuation. In contrast, samples containing the amine developer, molded under identical conditions, exhibit low volume resistivity and high EMI attenuation. As metal and/or developer level in the formulation increases lower molding times/temperatures are required to achieve high levels of EMI attenuation and volume conductivity.

EXAMPLE 18

Nylon 6 extrudates, containing various levels of nickel powder and of N,N-bis (2-hydroxyethyl) tallowamine, produced as described in Example 17 were injection molded on a Newbury 50 ton reciprocating screw machine fitted with a 4"×3"×1/16" (102×76×1.6 mm) mold cavity. Various barrel/die temperature regimes were employed, together with different overall cycle times (Note: on the machine used the polymer formulation is exposed to barrel temperature for approximately eight times the cycle time). After molding, the samples were evaluated for volume resistivity. The results are shown in the Table VIII.

TABLE VIII

| Wt % Ni | Wt % Amine | Cycle Time (s) | Barrel/Die Temp (°C.) | Volume Resistivity ohm cm |
|---|---|---|---|---|
| 35 | 0 | 90 | 245/260/260 | $1.4 \times 10^7$ |
| 35 | 2.5 | 90 | 235/250/250 | $7.6 \times 10^7$ |
| 35 | 2.5 | 90 | 240/255/255 | $3.0 \times 10^7$ |
| 35 | 2.5 | 90 | 245/260/260 | 1.5 |
| 35 | 1.0 | 90 | 245/260/260 | 0.2 |
| 35 | 1.0 | 90 | 245/260/260 | 0.48 |
| 25 | 2.5 | 90 | 245/260/260 | $10^{13}$ |

It can be noted that enhancement of the volume conductivity by the use of the amine developer of the present invention requires the use of a suitable barrel/die temperature profile and suitable cycle time. These parameters may vary with the design of the injection molding machine used but can be determined experimentally.

EXAMPLE 19

Noryl (N225/78, General Electric) formulations containing various levels of nickel powder (Alcon 756) and of N,N-bis (2-hydroxyethyl) cocoamine were prepared by extrusion in a similar fashion to that described in Example 17. The pellets obtained were compression molded. The molding temperatures and times used, and the volume resistivities and EMI attenuations measured are shown in the Table below IX.

TABLE IX

| Wt % Ni | Wt % Amine | Molding Temp (°C.) | Molding Time (m) | Volume Resistivity ohm cm | EMI Attenuation (dB) at | | | |
|---|---|---|---|---|---|---|---|---|
| | | | | | 30 | 100 | 300 | 1000 Mhz |
| 35 | 0 | 225 | 27 | $10^{13}$ | 00 | 00 | 01 | 00 |
| | | 240 | 60 | $10^{13}$ | 00 | 00 | 02 | 00 |
| | | 255 | 20 | $10^{13}$ | 00 | 00 | 04 | 00 |
| 35 | 5 | 225 | 27 | $10^{13}$ | 00 | 00 | 05 | 01 |
| | | 240 | 60 | 7.7 | 35 | 29 | 30 | 11 |
| | | 255 | 20 | 0.2 | 57 | 52 | 70 | 72 |
| 40 | 5 | 257 | 15 | 0.21 | 52 | 43 | 55 | 63 |

Again it is clear that an amine developer of the present invention effects a dramatic increase in the volume conductivity and EMI attenuation of nickel filled polyphenylene oxide formulations. Also note that the molding temperature has to be sufficiently high to allow the amine developer to function effectively in a reasonable time.

EXAMPLE 20

Formulations of polybutylene terephthalate (PBT) containing 30% glass fiber (Valox 420, General Electric) were compounded as described in Example 17 to contain various levels of nickel filler and various levels of N,N-bis (2-hydroxyethyl) lauramide. The pellets obtained were compression molded for the times, and at the temperatures, shown in the Table below. The values for EMI attenuation and volume resistivity measured are also depicted in Table X.

TABLE X

| Wt % Ni | Wt % Amine | Molding Temp (°C.) | Molding Time (m) | Volume Resistivity ohm cm | EMI Attenuation (dB) at | | | | |
|---|---|---|---|---|---|---|---|---|---|
| | | | | | 30 | 100 | 300 | 1000 | Mhz |
| 35 | 0 | 245 | 22 | $10^{13}$ | 01 | 00 | 14 | 05 | |
| 35 | 1 | 245 | 22 | 0.78 | 47 | 37 | 50 | 40 | |
| 30 | 1 | 250 | 27 | 0.42 | 52 | 46 | 58 | 48 | |
| 30 | 1 | 245 | 27 | 0.79 | 46 | 34 | 47 | 40 | |
| 25 | 1 | 245 | 27 | 2.0 | 40 | 30 | 39 | 19 | |
| 20 | 1 | 250 | 27 | $10^{13}$ | 04 | 03 | 16 | 03 | |

Hence an amide developer of the present invention is able to effect a large increase in the volume conductivity and EMI attenuation of a glass-reinforced, nickel filled, polyester formulation. Because of the diluent effect of the glass reinforcement reasonable conductivity could be achieved by the use of the developer at somewhat lower weight % nickel loadings than in unreinforced nickel filled thermoplastics.

EXAMPLE 21

A glass reinforced PBT (Valox 420) formulation was compounded, as described above, to contain 30% by weight of nickel powder and 1% by weight of N,N-bis-(2-hydroxyethyl) lauramide. The resulting pellets were used to produce injection molded specimens using barrel/die temperatures of 250°/270°/270° C. and a cycle time of 90 seconds. When assessed for volume resistivity the molded specimens gave values of approximately 2.5 to 4.5 ohm.cm; i.e., the specimens possessed good volume conductivity.

EXAMPLE 22

200 g of N,N-bis(2-hydroxyethyl)tallowamine were heated to 190°-200° C. while being stirred with a high shear type stirrer blade. To this was added in portions, 60 g of polypropylene. After 10-15 minutes at 200° C. the polypropylene had melted and become dispersed into the amine to yield a homogenous viscous fluid. To this was added 40 g of copper powder. Stirring was continued for 2 minutes after attaining homogeniety. The whole mixture was then poured quickly into a cold dish so that rapid cooling and solidification occurred. The solid was chopped into pieces and ground in a food blender in the presence of isopropanol (this solvent extracts the amine to leave a copper loaded microporous polymer such as described in U.S. Pat. No. 4,519,909; scanning electron microscopy confirmed the presence of microporous polypropylene). After recovering the Cu loaded polymer by filtration, it was washed repeated with isopropanol until the washings were colorless. The polymer was then dried 4 hours at 50° C. to remove the solvent. These copper loaded PP granules were then compression molded at 215° C. for 17 minutes under 5 tpsi (69 MPa) pressure and 3"×6"×0.125" (152×76.2×3.17 mm) samples obtained. The volume resistance was measured as 0.8 ohm cm, indicating that this procedure for producing a microporous copper filled polypropylene results in material exhibiting excellent conductivity The samples molded also exhibited greater than 40 db of EMI attenuation when assessed by the near field method according to ASTM ES7-85.

In similar experiments the weight % loading of copper in polypropylene was reduced from the 40% used above, to 35% and 30% by weight. Volume resistance of samples molded from such material was 0.8 and 0.13 ohm cm respectively.

EXAMPLE 23

Microporous polypropylene was prepared by the procedure outlined in Example 20, except that 40% by weight of nickel flake (Alcan 756) to polypropylene was used in place of the copper powder. Molded samples were observed to possess volume resistances of 13 to 250 ohm cm.

EXAMPLE 24

Equal weights of an epoxy resin (Shell Epon 828) and a hardener (Dow Versamid 125) were mixed together. Copper powder (Poudmet 22BB400) was added slowly to the mixture, with hand mixing, so as to afford a formulation which contained resin: hardener: copper in weight ration of 15:15:70. The copper filled resin was divided into two equal portions. To one portion was added and mixed in an amount of N,N-bis(2-hydroxyethyl) cocoamine equivalent to 5% by weight of the copper powder contained therein. Each portion was then transferred to an aluminum dish and allowed to stand at room temperature for 8 hours; during this time the epoxy resin became cured via the action of the hardener and the nature of the samples changed from fluid to solid. Upon removal of the cured portions from the trays neither exhibited any indication of conductivity when tested with a 2-probe ohmmeter. Each portion was cut into 2 halves. One half from each portion was placed in separate glass vessels, which were thereafter evacuated to below 1 mm Hg of pressure. The vessels were sealed and heated in an oven at 220° C. for 30 minutes, then removed, cooled to ambient, and the samples removed and reassessed for conductivity by the use of a 2-probe ohmmeter. Again neither specimen exhibited any measurable conductivity. These experiments indicate that the addition of a developer of the present invention to the particular epoxy (Thermoset) resin used and containing 50 to 70% by weight of copper does not result in enhanced conductivity. This is in contrast to the results described for thermoplastics in the Examples above; a complete explanation for the non-enhancement of conductivity of the copper-filled epoxy resin by the developing agent is not available; however, encapsulation of the individual copper particles by the fluid uncured resin is one possible reason. It is likely that more extensive formulation work with a variety of other thermosetting plastics (epoxy and non-epoxy types) would reveal conditions under which copper filled thermosetting resins could be rendered more conductive by the use of developers of the present invention.

We claim:

1. A conductive metal-filled substrate produced by the method comprising:

a. an intermingling step of intermingling metal particles in a deformable substrate, wherein the metal particles are selected from the group consisting of copper, nickel, and combinations thereof, and are intermingled in a quantity sufficient to achieve a conductive three-dimensional substrate;

b. a contacting step of contacting the metal particles with a developing agent comprising a long-chain aliphatic tertiary amine; and c. a heating step of subjecting the metal particles and the developing agent to heat, in the substantial absence of oxygen, at a temperature and for a duration sufficient to improve the conductivity of the metal-filled substrate.

2. The conductive metal-filled substrate of claim 1 wherein said intermingling step comprises melt blending the metal particles into the substrate.

3. The conductive metal-filled substrate of claim 1 wherein said intermingling step comprises blending the metal particles into an uncured resin at ambient temperature.

4. The conductive metal-filled substrate of claim 1 wherein the copper or nickel contains less than about 40 weight % of nonconductive substrate forming metals.

5. The conductive metal-filled substrate of claim 1 wherein the copper or nickel contains less than about 20 weight % of nonconductive substrate forming metals.

6. The conductive metal-filled substrate of claim 1 wherein the metal particles have a number average particle size of less than about 30 um.

7. The conductive metal-filled substrate of claim 1 wherein the metals are present in the form of a mixture containing less than about 25 weight % of other non-conductive-substrate forming metals.

8. The conductive metal-filled substrate of claim 1 wherein said heating step takes place at temperature below the melting point of any substantially present metal.

9. The conductive metal-filled substrate of claim 1 wherein said heating step takes place at or above the softening point of the substrate.

10. The conductive metal-filled substrate of claim 1 wherein the substrate is a synthetic resin.

11. The conductive metal-filled substrate of claim 10 wherein the substrate is a thermoplastic resin.

12. The conductive metal-filled substrate of claim 1 wherein said contacting step comprises contacting the developing agent in liquid form with the metal particles prior to said intermingling step.

13. The conductive metal-filled substrate of claim 1 wherein said contacting step and said heating step take place prior to said intermingling step.

14. The conductive metal-filled substrate of claim 1 wherein said contacting step comprises incorporating the developing agent into the substrate prior to said intermingling step.

15. The conductive metal-filled substrate of claim 1 wherein said contacting step comprises incorporating the developing agent into the substrate simultaneous with said intermingling step.

16. The conductive metal-filled substrate of claim 1 wherein said contacting step comprises incorporating the developing agent into the substrate subsequent to said intermingling step.

17. The conductive metal-filled substrate of claim 1 wherein the tertiary amine has at least one $C_8$ to $C_{20}$ alkyl group.

18. The conductive metal-filled substrate of claim 17 wherein at least one $C_8$ to $C_{20}$ alkyl group is a coco, tallow, or hydrogenated tallow group.

19. The conductive metal-filled substrate of claim 18 wherein the tertiary amine also contains a hydroxyalkyl group.

20. The conductive metal-filled substrate of claim 19 wherein the tertiary amine is N,N-bis(2-hydroxyethyl)-cocoamine or N,N-bis(2-hydroxyethyl)tallow amine.

* * * * *